United States Patent
Matsui et al.

(10) Patent No.: US 7,052,620 B2
(45) Date of Patent: May 30, 2006

(54) POLISHING SLURRY FOR ALUMINUM-BASED METAL, AND METHOD OF MANUFACTURING SEMICONDUCTOR DEVICE

(75) Inventors: Yukiteru Matsui, Yokohama (JP); Gaku Minamihaba, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 84 days.

(21) Appl. No.: 10/378,994

(22) Filed: Mar. 5, 2003

(65) Prior Publication Data

US 2003/0173329 A1    Sep. 18, 2003

(30) Foreign Application Priority Data

Mar. 8, 2002    (JP)    ............... 2002-064210

(51) Int. Cl.
*B44C 1/22* (2006.01)
*C23F 1/00* (2006.01)

(52) U.S. Cl. .................. 216/38; 216/17; 216/18; 438/691; 438/692; 252/79.1

(58) Field of Classification Search .............. 216/17, 216/18, 38; 438/691, 692; 252/79.1

See application file for complete search history.

(56) References Cited

U.S. PATENT DOCUMENTS

| 5,770,095 | A | 6/1998 | Sasaki et al. ............ 216/38 |
| 6,585,786 | B1* | 7/2003 | Tsuchiya et al. .......... 51/307 |
| 6,596,638 | B1* | 7/2003 | Kondo et al. ............ 438/690 |
| 6,740,589 | B1* | 5/2004 | Shimazu et al. .......... 438/691 |
| 2001/0006224 | A1* | 7/2001 | Tsuchiya et al. ......... 252/79 |

FOREIGN PATENT DOCUMENTS

| JP | 09-148431 | 6/1997 |
| JP | 2000-133621 | 5/2000 |
| JP | 2001-110759 | 4/2001 |
| JP | 2001-303050 | 10/2001 |
| JP | 2002-164308 | 6/2002 |

OTHER PUBLICATIONS

Japanese Patent Office Notification of Reasons for Rejection and English translation thereof. Application No. 2002064210.

* cited by examiner

*Primary Examiner*—Shamim Ahmed
(74) *Attorney, Agent, or Firm*—Finnegan, Henderson, Farabow, Garrett & Dunner, L.L.P.

(57) ABSTRACT

A polishing slurry for an aluminum-based metal includes an oxidizing agent having a standard electrode potential of 1.7 V or more, amino acid or amino acid compound, and bi- or higher than bi-valent aromatic carboxylic acid having a carbocycle or a heterocycle.

12 Claims, 3 Drawing Sheets

POLISHING SLURRY FOR ALUMINUM-BASED METAL, AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2002-064210, filed Mar. 8, 2002, the entire contents of which are incorporated herein by reference.

BACKGROUND OF THE INVENTION

1. Field of the Invention

The present invention relates to a polishing slurry for aluminum-based metal, and in particular, to a polishing slurry for aluminum-based metal which is suited for use in the formation of a damascene wiring to be employed in a DRAM, an FeRAM or a high-speed logic LSI, and to the method of manufacturing a semiconductor device by making use of this polishing slurry.

2. Description of the Related Art

In recent years, a buried wiring (damascene wiring) processing technique has been intensively studied and developed in order to simplify the manufacturing steps and to improve the yield and reliability in the back-end process in the semiconductor super-LSI manufacturing technique. In particular, the CMP (Chemical Mechanical Polishing) technique is indispensable in the process of forming a damascene wiring.

At present, a copper damascene wiring technique where copper is employed as a wiring metal is mainly employed in the back-end process of a high-speed logic device.

On the other hand, in the back-end process of a memory device represented by DPAM, the damascene wiring technique where aluminum or tungsten is employed as a wiring metal is employed in view of low processing cost. Among them, a damascene wiring using aluminum (aluminum damascene wiring) is considered as being most promising in view of the fact that aluminum is lowest in electric resistance next to copper.

The manufacturing process of aluminum damascene wiring is mainly constituted by a step of forming a wiring groove in an interlayer insulating film, a step of forming an aluminum film (burying step), and a step of performing CMP of aluminum. It is required, in the process of forming an aluminum film, to improve the burying characteristics of aluminum in the wiring groove and to minimize damage to capacitors. In order to meet these requirements, forming a liner made of titanium, niobium or a nitride of these metals (barrier metal) on the inner wall of the wiring groove is now being studied. There is a problem in this CMP process that the orientation of the aluminum film that has been deposited on the liner material is greatly altered by the liner material, and, according to the conventional polishing technique, the polishing rate of aluminum is very sensitive to the orientation of the aluminum film.

Namely, although a relatively high polishing rate of aluminum can be achieved when the aluminum film has a desirable orientation, the orientation of aluminum film may become undesirable depending on the structure of the liner, so that if the orientation of aluminum film becomes undesirable, the polishing rate of the aluminum film would be lowered to 1/10 as shown in FIG. 3 for instance.

It may be possible, if it is desired to achieve a practical polishing rate, to increase the polishing rate by raising the working pressure DF on the occasion of CMP from 300 gf/cm$^2$ to 500 gf/cm$^2$ for instance as indicated by the arrow in FIG. 3. In that case however, the planarity of the surface thus polished would be greatly deteriorated as shown in FIG. 4.

On the occasion of the CMP of a metal film, the surface of the metal film is generally ionized by an oxidant (a), so that a protective film made of a metal oxide or of a metal compound combined with an additive would be formed on the surface of the metal film (b) as shown in FIG. 6. Since this surface protective film is fragile in general as compared with pure metals, this surface protective film can be removed by polishing particles (c), and hence the polishing can be permitted to proceed by repeating these steps.

Therefore, keys to a high polishing rate are a rapid oxidation of the surface of metal film, the formation of an optimum protective film and the polishing power of the polishing particles.

In the conventional polishing technique, ammonium persulfate and hydrogen peroxide are generally employed. In this case, ordinary oxidation reactions represented by the following formulae are utilized.

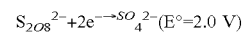

$S_2O_8^{2-} + 2e^- \rightarrow SO_4^{2-}$ (E°=2.0 V)

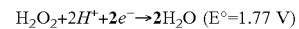

$H_2O_2 + 2H^+ + 2e^- \rightarrow 2H_2O$ (E°=1.77 V)

However, since ammonium persulfate and hydrogen peroxide are relatively low in redox potential, i.e. E°=2.0 V or less, and hence, are insufficient in oxidizing power, an aluminum film having an orientation of (111) can be easily oxidized, whereas an aluminum film having an orientation of (110) or (100) can be hardly oxidized as shown in FIGS. 2A and 5A. Therefore, an aluminum film having a desirable orientation, i.e. an orientation of (111), can be polished at a high polishing rate. By contrast, in the case of an aluminum film having an undesirable orientation wherein crystal planes (110) and (100) are mixed together, the polishing rate thereof would be sharply deteriorated.

BRIEF SUMMARY OF THE INVENTION

According to one aspect of the present invention, there is provided a polishing slurry for an aluminum-based metal, which comprises an oxidizing agent having a standard electrode potential of 1.7 V or more; amino acid or amino acid compound; and bi- or higher than bivalent aromatic carboxylic acid having a carbocycle or a heterocycle.

According to another aspect of the present invention, there is also provided a method of manufacturing a semiconductor device, the method comprising:

forming a groove and/or a hole in an insulating film formed above a semiconductor substrate;

depositing an aluminum-based metal film on the insulating film to thereby bury the groove and/or the hole with the aluminum-based metal film; and removing a portion of the aluminum-based metal film which is deposited on the insulating film by making use of a polishing slurry comprising an oxidizing agent having a standard electrode potential of 1.7 V or more, amino acid or amino acid compound, and bi- or higher than bi-valent aromatic carboxylic acid having a carbocycle or a heterocycle to thereby form a buried wiring layer in the groove and/or the hole.

DETAILED DESCRIPTION OF THE INVENTION

Figure 1A:
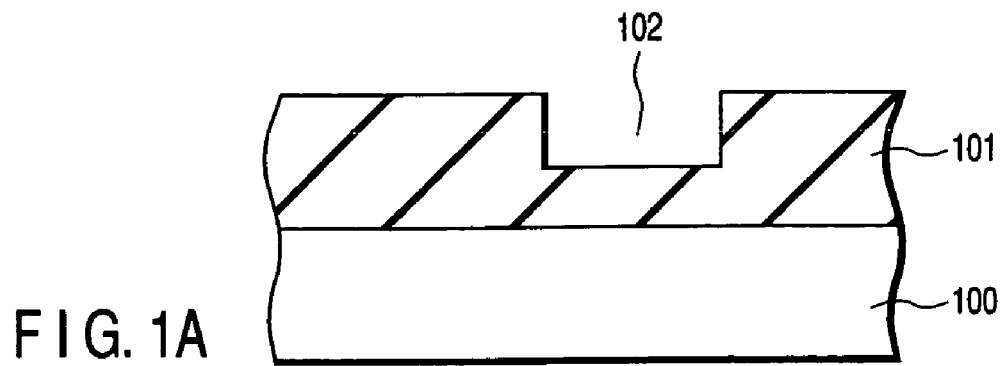
FIGS. 1A to 1C are cross-sectional views each illustrating, stepwise, the process of forming an Al alloy damascene wiring according to Example 1 of the present invention.

Next, the embodiments of the present invention will be explained in detail.

The body to be polished (hereinafter referred to as the polishing body), to which the polishing slurry according to one embodiment of the present invention can be applied is an aluminum film or an aluminum alloy film. As for the aluminum alloy film, it is possible to employ aluminum-copper, aluminum-silicon, aluminum-silicon-copper, etc. It is preferable among these aluminum alloys to employ an alloy containing a metal which is capable of forming a complex with an amino acid. As for the metal which is capable of forming a complex with an amino acid, it is possible to employ copper, iron, silver, niobium, ruthenium and titanium, wherein copper is most preferable among them.

The oxidizing agent to be included in the polishing slurry according to this embodiment is selected from those having a standard electrode potential of 1.7 V or more. Because, if the standard electrode potential of the oxidizing agent is less than 1.7 V, the oxidizing powder of the oxidizing agent may become insufficient, thus degrading the polishing rate of the aluminum film, etc.

As for the oxidizing agent having a standard electrode potential of 1.7 V or more, it is possible to employ ammonium persulfate (standard electrode potential E°: 2.0 V), hydrogen peroxide (standard electrode potential E°: 1.7 V), ozone (standard electrode potential E°: 2.076 V), etc. Among them, ammonium persulfate and hydrogen peroxide are more preferable, since these compounds are capable of retaining a sufficient oxidizing power for a long period of time.

The concentration of these oxidizing agents in a polishing slurry may preferably be confined within the range of 0.1 to 5% by weight. If the concentration of these oxidizing agents is less than 0.1% by weight, it may become difficult to secure a sufficient polishing rate, and if the concentration of these oxidizing agents exceeds over 5% by weight, it may lead to the corrosion of the metal constituting the wirings.

As for the amino acid to be included in the polishing slurry according to this embodiment, it is possible to employ glycine, alanine, phenyl alanine, etc. Among them, glycine is most preferable. The concentration of the amino acid in a polishing slurry may preferably be confined within the range of 0.1 to 5% by weight. If the concentration of amino acid is less than 0.1% by weight, it may become difficult to secure a sufficient catalytic effect and also to achieve a high polishing rate without depending on the crystal orientation of the polishing surface, and if the concentration of amino acid exceeds over 5% by weight, it may lead to the deterioration of the resultant polishing slurry.

The reasons for degrading the dispersibility of polishing slurry as the concentration of amino acid becomes excessively high, may be attributed to the fact that since the amino acid is permitted to exist as an amphoteric ion in the polishing slurry (for example, in the case of glycine, as $H_2N^+CH_2COO^-$), amino acid is more likely to flocculate together with other kinds of additive or polishing particles which are being positively or negatively charged.

It is also possible to employ an amino acid compound in place of an amino acid. As for specific examples of the amino acid compound, it is possible to employ a metal complex of an amino acid. As for the metal constituting the metal complex, it may be at least one metal selected from the group consisting of copper, iron, silver, niobium, ruthenium and titanium.

Namely, when the body to be polished is formed of pure aluminum, it may be impossible for amino acid to form a complex with other kinds of metal such as copper that may be included in the body to be polished. Therefore, it is required to incorporate a metal complex of an amino acid itself or a metal compound which is capable of forming a metal complex with an amino acid into a polishing slurry.

The polishing slurry according to this embodiment comprises a bi- or higher than bi-valent aromatic carboxylic acid having a carbocycle or a heterocycle. As for the aromatic carboxylic acid having a carbocycle, it is possible to employ phthalic acid, trimellitic acid and pyromellitic acid. As for the aromatic carboxylic acid having a heterocycle, it is possible to employ quinolinic acid (pyridine-2,3-dicarboxylic acid), nicotinic acid (pyridine-3-dicarboxylic acid), cinchomeronic acid (pyridine-3,4-dicarboxylic acid), pyridine-2,3,4-dicarboxylic acid, etc. Among them, quinolinic acid is most preferable.

These aromatic carboxylic acids having a carbocycle or a heterocycle can be bonded with aluminum which has been ionized by an oxidizing agent to thereby form a surface protecting film which can be easily polished. Since this surface protecting film has a great influence on the polishing characteristics of the body to be polished, the selection of the aromatic carboxylic acid is very important.

For example, if the aromatic carboxylic acid is not incorporated into the polishing slurry, it would be impossible to realize a practically sufficient polishing rate. Because, aluminum that has been oxidized (ionized) by an oxidizing agent is permitted to bond with oxygen, thereby rendering aluminum to easily form a hard alumina ($Al_2O_3$). As a result, the surface protecting film may be turned into a hard film which can hardly be abraded by means of the polishing particles. As for the aromatic carboxylic acid which is capable of forming the aforementioned surface protecting film, it is preferable to select those which can easily interact with ionized aluminum and which have a suitable degree of hydrophobic moiety.

Namely, it is preferable to employ a bi- or higher than bi-valent aromatic carboxylic acid which enables easy formation of a surface protective film which is slightly soluble or insoluble. Among the aromatic carboxylic acids having such features as mentioned above, quinolinic acid which is dicarboxylic acid having pyridine ring is most suited for use in a polishing slurry for the CMP of aluminum-based metal.

The reasons for this is that since the dicarboxylic acid having two carboxylic groups is small in dissociation constant, it can easily exist as COO$^-$ and hence can strongly bond with Al$^{+++}$ having positive electric charges, thereby enabling it to form the surface protective film. In contrast, if quinaldinic acid which is monocarboxylic acid having a heterocycle is employed, it would be difficult to form the aforementioned surface protective film, since it is relatively large in dissociation constant, and hence it can hardly bond with Al$^{+++}$.

Therefore, if quinaldinic acid is substituted for quinolinic acid, it may become difficult to realize a sufficiently high polishing rate.

On the other hand, if malonic acid or succinic acid, both of which are dicarboxylic acid but are very weak in hydrophobicity, is substituted for quinolinic acid, it is possible to realize a high polishing rate which is satisfactory in practical viewpoint. However, the protective film that can be formed from these aliphatic carboxylic acids exhibiting weak hydrophobicity may become soluble so that it may be impossible to inhibit the generation of dishing, thus raising a problem of deterioration in planarity of the polished surface.

Therefore, since quinolinic acid is dicarboxylic acid, it can easily bond with Al$^{+++}$ that has been ionized through oxidation, and moreover, the protective film thus formed has a suitable degree of hydrophobicity, so that the quinolinic acid is most suited for use as aromatic carboxylic acid for creating the aforementioned protective film.

As for preferable examples of aromatic carboxylic acid other than quinolinic acid, it is possible to employ dicarboxylic acid having a benzene ring (phthalic acid). Further, in addition to dicarboxylic acid, it is also possible to preferably employ aromatic tricarboxylic acid which is low in dissociation constant and has three carboxylic groups such as tricarboxylic acids having pyridine ring (cinchomeronic acid) or tricarboxylic acids having benzene ring.

The content of aromatic carboxylic acid, in particular, quinolinic acid in the polishing slurry may preferably be confined within the range of 0.1 to 1.0% by weight. Because, if the content of aromatic carboxylic acid in the polishing slurry is less than 0.1% by weight, it may become difficult to achieve a satisfactory formation of protective film, thereby making it difficult to realize a sufficiently high polishing rate in practical viewpoint. On the other hand, if the content of aromatic carboxylic acid in the polishing slurry exceeds over 1.0% by weight, the solubility of the protective film may become excessively high.

The polishing slurry according to this embodiment may further contain abrasive particles, a surfactant, etc., other than the aforementioned components. As for the specific examples of the abrasive particles, it includes silica, alumina, zirconia and ceria. As for the specific examples of the surfactant, it is preferable to employ a low molecular surfactant having a molecular weight of 100 or less, and the surfactant may be a cationic, anionic or nonionic surfactant.

As for the specific examples of the cationic and anionic surfactants, it is preferable to employ those having a benzene ring, such as potassium dodecylbenzene sulfonate, ammonium dodecylbenzene sulfonate, etc. As for the specific examples of the nonionic surfactant, it is preferable to employ those having a HLB value of 20 or less, such as acetylene diol type nonionic surfactant, perfluoroalkylethylene oxide adduct, etc.

Next, the mechanism in the polishing of an Al-based metal by making use of the polishing slurry according to this embodiment explained above will be explained as follows.

When an Al-based metal layer is polished by making use of the polishing slurry according to this embodiment, the amino acid included in the polishing slurry for instance forms a complex with a metal such as copper which has been included in the Al-based metal. In this manner, a metal complex of an amino acid existing in the polishing slurry functions as a catalyst for an oxidizing agent. More specifically, due to the presence of the metal complex of amino acid, radicals exhibiting a strong oxidizing power generate, thereby making it possible to greatly intensify the oxidizing power of the oxidant. As a result, the surface of the Al-based metal is strongly oxidized and ionized. This oxidation can proceed smoothly without depending on the crystal orientation of the Al-based metal.

The ionized aluminum forms an oxide and at the same time, bonds with an aromatic carboxylic acid to form a surface protective film. On the other hand, an amino acid that did not contribute to the formation of the metal complex is now permitted to bond with the ionized aluminum thereby to form a part of the surface protective film.

The surface protective film which has been formed in this manner is slightly soluble or insoluble, thereby enabling it to function as a surface protective film, thus making it possible to effectively prevent the generation of dishing. Further, since this surface protective film can be easily removed by means of polishing, the polishing of surface can be proceeded at a high polishing rate without being influenced by the crystal orientation of the Al-based metal. Moreover, since the polishing can be performed using a relatively low working pressure without depending on the crystal orientation of the Al-based metal, it is now possible to form an Al-based metal wiring which is excellent in planarity without generating dishing.

Next, various examples of the present invention will be explained in detail.

EXAMPLE 1

Figure 1B:
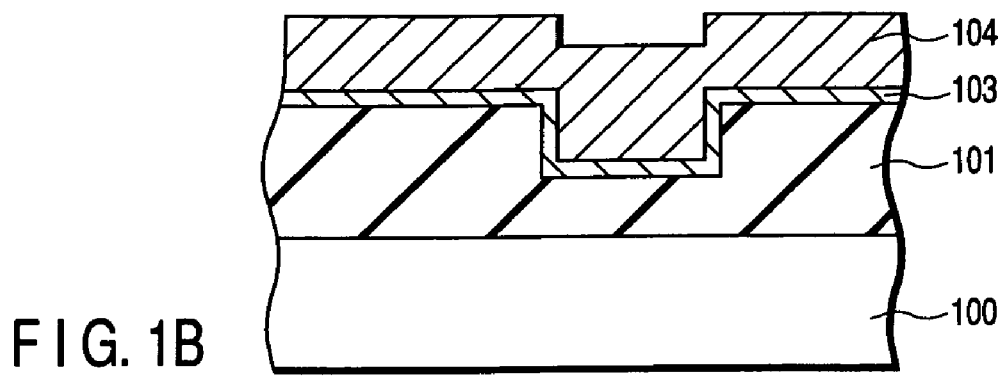
Figure 1C:
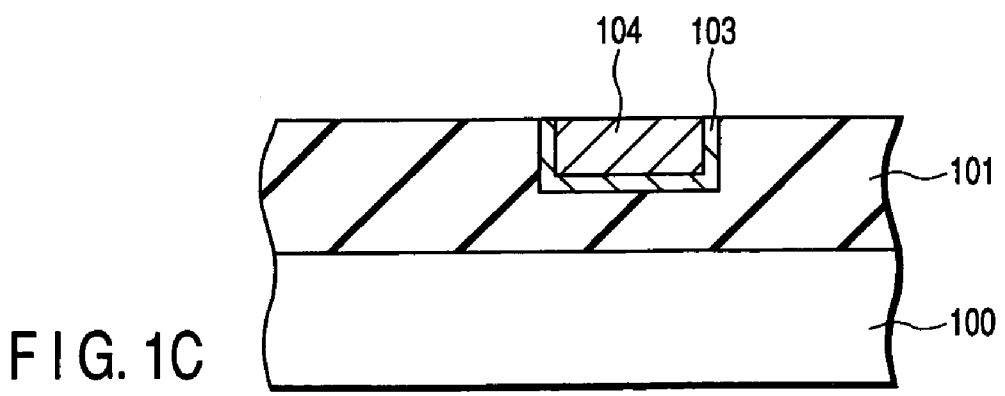

This example will be explained with reference to FIGS. 1A to 1C, wherein an aqueous solution comprising 1% by weight of ammonium persulfate as an oxidizing agent, and 1% by weight of glycine was employed as a polishing slurry to polish an aluminum alloy film containing 0.5 atomic % of copper, thereby forming an aluminum damascene wiring.

First of all, an SiO$_2$-based interlayer insulating film 101 was deposited on a silicon substrate 100 having integrated semiconductor devices (not shown) formed thereon. Then, a wiring groove 102 having a depth of 400 nm was formed in the surface of the interlayer insulating film 101 (FIG. 1A). Then, a liner film 103 having a thickness of 15–50 nm and constituted by niobium, titanium or a nitride thereof was deposited on the interlayer insulating film 101 as well as on the inner wall of the wiring groove 102. Furthermore, an aluminum alloy film 104 having a thickness of 800 nm and containing 0.5 atomic % of copper was deposited on the surface of this liner film 103 (FIG. 1B).

Then, that portion of the aluminum alloy film 104 as well as that portion of the liner film 103, which were located other than those disposed inside the wiring groove 102, were polished away by means of CMP treatment. As a result, the liner film 103 and the aluminum alloy film 104 were buried inside the wiring groove 102 (FIG. 1C).

The polishing slurry for CMP employed herein contained 0.75% by weight of quinolinic acid, 0.075% by weight of surfactant (potassium dodecylbenzene sulfonate) as a dishing-suppressing agent, and 0.5% by weight of γ-alumina as an abrasive particle, in addition to ammonium persulfate and glycine mentioned above, The polishing was performed according to the following polishing conditions.

Polishing pad: IC1000/Suba 400;
Load: 300 gf/cm².
Rotational speed of top ring: 120 rpm.
Rotational speed of turn table: 100 rpm.
Flow rate of slurry: 200 cc/min.

As the polishing was initiated, a copper-glycine complex ($Cu(H_2NCH_2COOH)_2$) was formed through a reaction between the copper included in the aluminum alloy film 104 and the glycine incorporated into the polishing slurry. This amino acid compound (metal complex) functioned as a catalyst for ammonium persulfate. Namely, first of all, a sulfuric acid radical was generated according to the following reaction formula in the presence of $Cu(H_2NCH_2COOH)_2$.

$$S_2O_8^{2-} + e^- \rightarrow SO_4^{2-} + SO_4^{\cdot-}$$

This sulfuric acid radical exhibited a very strong oxidizing power. The redox potential of the sulfuric acid radical was about 1.5 times as high as the redox potential (2.0 V) that could be conventionally derived from ammonium persulfate as shown in the following formula.

$$SO_4^{\cdot-} + e^- \rightarrow SO_4^{2-} \; (E°=3.19 \text{ V})$$

Figure 2A:
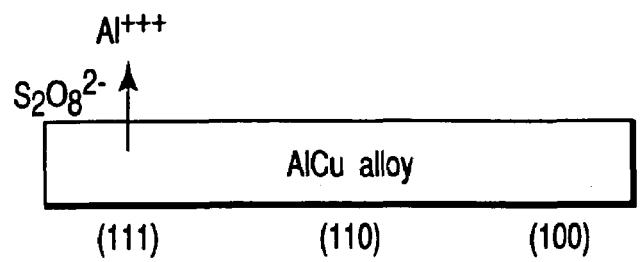
FIGS. 2A and 2B are diagrams illustrating the crystal orientation dependency of the oxidizing power of an oxidizing agent in the prior art and in Example 1, respectively.
Figure 2B:
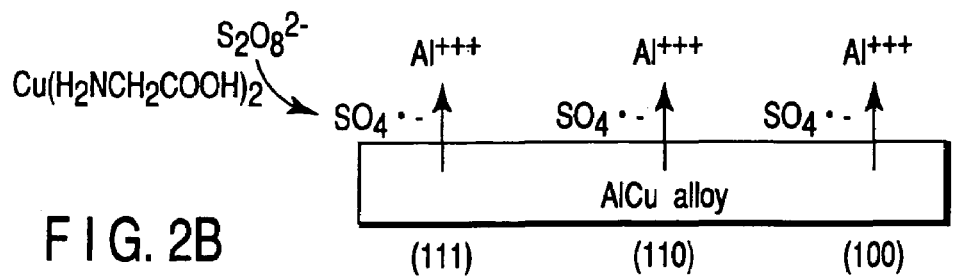

Owing to the sulfuric acid radical generated in this manner, it was possible to easily oxidize all of the aluminum alloy of (111), (110) and (100) without depending on the crystal orientation (FIG. 2B). The aluminum $Al^{+++}$ ionized through oxidation was permitted to bond with quinolinic acid to form a surface protective film. Further, an excessive portion of glycine that was not contributed to the formation of the copper-glycine complex was also permitted to bond with the ionized aluminum to thereby form a portion of the surface protective film.

The surface protective film which was formed in this manner could be promptly polished away by making use of alumina particle employed as polishing particle without depending on the crystal orientation.

Figure 3:
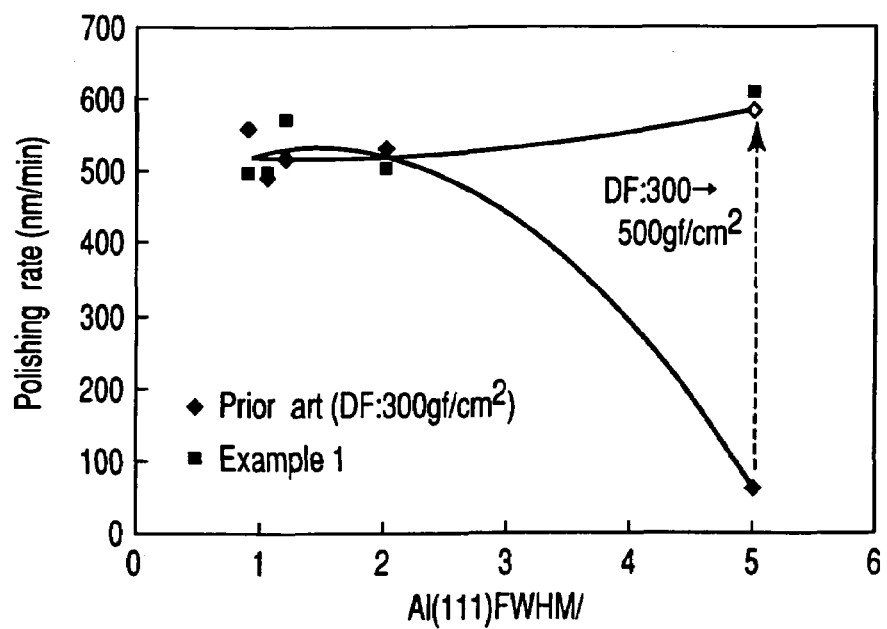
FIG. 3 is a graph illustrating the crystal orientation dependency of the polishing rate of an Al alloy in the prior art and in Example 1.

Namely, when the polishing was performed under the same conditions as explained above except that the crystal orientation (orientation: full width at half maximum (FWHM) of Al(111)) of the aluminum alloy film was variously altered, it was possible to realize a high polishing rate of 500 nm/min without depending on the crystal orientation as shown in FIG. 3. Since it was possible in this manner to perform the polishing of aluminum alloy film at a relatively low working pressure (load) without depending on the crystal orientation of the film, it was possible to form an aluminum damascene wiring which was excellent in planarity.

Figure 4:
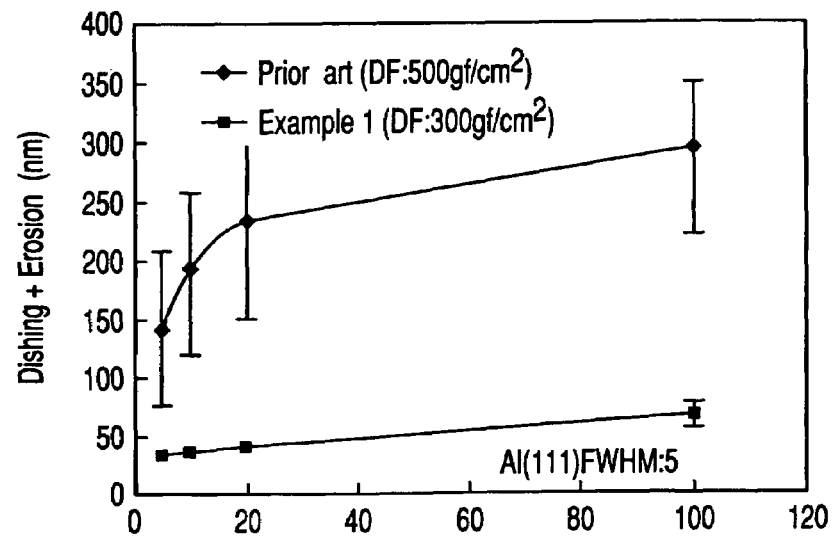
FIG. 4 is a graph illustrating the line width dependency of the planarity of an Al alloy damascene wiring in the prior art and in Example 1.

Additionally, when the polishing was performed under the same conditions as explained above except that the width of wiring was variously altered, it was possible to realize the polishing of aluminum alloy film at a relatively low working pressure of 300 gf/cm². As a result, it was possible as shown in FIG. 4 to minimize the generation of dishing and erosion irrespective of the width of the wiring.

Incidentally, when the polishing of aluminum alloy film was performed under the same conditions except that quinolinic acid was excluded from the polishing slurry, the polishing rate was lowered to 250 nm/min or less.

Further, when the polishing of aluminum alloy film was performed under the same conditions except that quinaldinic acid was substituted for quinolinic acid, the polishing rate was decreased to as low as 110 nm/min.

EXAMPLE 2

This example will be explained with reference to FIG. 5B, wherein an aqueous solution having the same composition as employed in Example 1 except that hydrogen peroxide was substituted for ammonium persulfate was employed.

As the polishing was initiated, a copper-glycine complex ($Cu(H_2NCH_2COOH)_2$) was formed through a reaction between the copper included in the aluminum alloy film and the glycine incorporated into the polishing slurry in the same manner as in Example 1. This amino acid compound (metal complex) functioned as a catalyst for hydrogen peroxide. Namely, first of all, a hydroxy radical was generated according to the following reaction formula in the presence of $Cu(H_2NCH_2COOH)_2$.

$$H_2O_{2+H}^+ + e^- \rightarrow OH\cdot + H_2O$$

This hydroxy radical exhibited a very strong oxidizing power. The redox potential of the hydroxy radical was about 1.6 times as high as the redox potential (1.77 V) that can be conventionally derived from hydrogen peroxide as shown in the following formula.

$$OH\cdot + H^+ + e^- \rightarrow H_2O \; (E°=2.8 \text{ V})$$

Figure 5A:
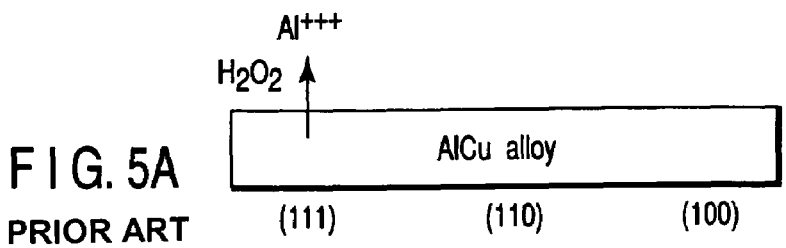
FIGS. 5A and 5B are diagrams illustrating the crystal orientation dependency of the oxidizing power of an oxidizing agent in the prior art and in Example 2, respectively.
Figure 5B:
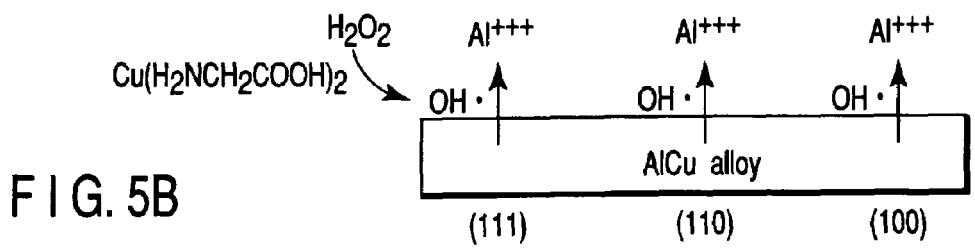
Figure 6:
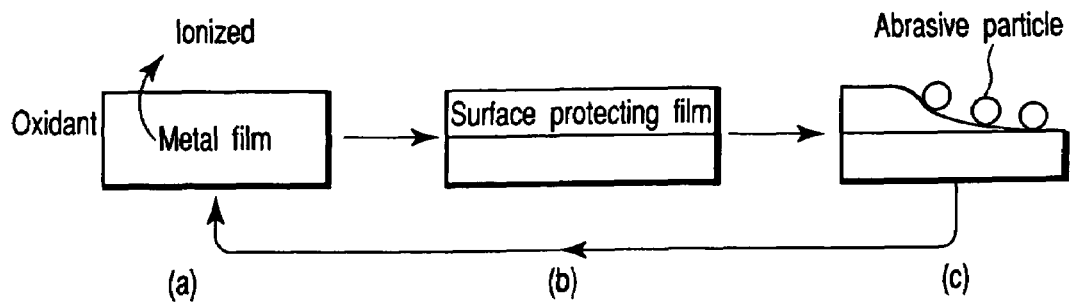
FIG. 6 is a diagram illustrating the polishing mechanism of the CMP of a metal film.

Owing to the hydroxy radical generated in this manner, it was possible to easily oxidize all of the aluminum alloy of (111), (110) and (100) without depending on the crystal orientation (FIG. 5B).

In accordance with the same mechanism as shown in Example 1, it was possible to perform the polishing of aluminum alloy film at a relatively high polishing rate and under a relatively low working pressure (load) without depending on the crystal orientation of the film. As a result, it was possible to form a damascene wiring of aluminum alloy which was excellent in planarity.

EXAMPLE 3

In this example, one embodiment where pure aluminum film was employed as a body to be polished will be explained. In Examples 1 and 2, the copper that was included in an aluminum alloy film employed as a polishing body was utilized as a metal having capability of forming a metal complex through a reaction thereof with an amino acid. Whereas, in this example, pure aluminum was employed as a polishing body. Accordingly, the copper included in the polishing body could not be employed. Therefore, a metal compound which was capable of forming a metal complex catalyst was incorporated into the polishing slurry.

In this example, a polishing slurry comprising ammonium persulfate, copper sulfate and glycine was employed as an oxidizing agent in the polishing of a pure aluminum film. As for the materials for the aromatic carboxylic acid, the dishing inhibitor and the polishing particles, the same kinds of materials as employed in Example 1 were employed.

A copper-glycine complex ($Cu(H_2NCH_2COOH)_2$) was formed through a reaction between the copper sulfate and the glycine in the polishing slurry. Namely, this copper-glycine complex was permitted to exist already in the polishing slurry prior to the polishing operation. This metal complex was capable of functioning as a catalyst for ammonium persulfate and of generating sulfuric acid radical exhibiting a strong oxidizing power according to the same reaction mechanism as illustrated in Example 1. As a result, it was possible to easily oxidize all of the aluminum alloy of (111), (110) and (100) without depending on the crystal orientation.

The aluminum which was ionized through oxidation was permitted to bond with quinolinic acid to form a surface protective film. Thereafter, the protective film was removed by means of polishing particles, and according to the same mechanism as shown in Example 1, it was possible to perform the polishing of aluminum alloy film at a relatively high polishing rate and under a relatively low working pressure (load) without depending on the crystal orientation of the film. As a result, it was possible to easily form a damascene wiring of aluminum which was excellent in planarity.

As explained above, according to the embodiments of the present invention, it is now possible to provide a polishing slurry for an aluminum-based metal, which is capable of easily performing the polishing of the aluminum-based metal at a relatively high polishing rate and under a relatively low working pressure DF (load) without depending on the crystal orientation of the aluminum-based metal. Therefore, it is now possible, through the employment of this polishing slurry, to form a buried wiring of aluminum-based metal, which is excellent in planarity without depending on the crystal orientation of the film and with a high throughput.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, the method comprising:
   forming a cavity, comprising at least one of a groove or a hole, in an insulating film formed above a semiconductor substrate;
   depositing an aluminum-based metal film above the insulating film thereby to bury the cavity with the aluminum-based metal film; and
   removing a portion of the aluminum-based metal film which is deposited above the insulating film by making use of a polishing slurry comprising an oxidizing agent having a standard electrode potential of 1.7 V or more, amino acid or amino acid compound, and bi- or higher than bi-valent aromatic carboxylic acid having a carbocycle or a heterocycle to thereby form a buried wiring layer in the cavity
   wherein said amino acid or amino acid compound forms a complex of metal, said complex functioning as a catalyst for the oxidizing agent.

2. The method according to claim 1, wherein the aluminum-based metal film is an aluminum film or an aluminum alloy film.

3. The method according to claim 2, wherein the aluminum alloy contains a metal which is capable of forming a complex with amino acid.

4. The method according to claim 3, wherein the metal which is capable of forming a complex with amino acid is at least one metal selected from the group consisting of copper, iron, silver, niobium, ruthenium, and titanium.

5. The method according to claim 3, wherein the amino acid is at least one compound selected from the group consisting of glycine, alanine, and phenyl alanine.

6. The method according to claim 5, wherein the amino acid is glycine which is incorporated in the polishing slurry at a concentration ranging from 0.1 to 5% by weight.

7. The method according to claim 1, wherein the oxidizing agent is at least one compound selected from the group consisting of ammonium persulfate, ozone, and hydrogen peroxide; and is included in the polishing slurry at a concentration of 0.1 to 5% by weight.

8. The method according to claim 1, wherein said bi- or higher than bi-valent aromatic carboxylic acid having a carbocycle is at least one compound selected from the group consisting of phthalic acid, trimellitic acid, and pyromellitic acid.

9. The method according to claim 1, wherein said bi- or higher than bi-valent aromatic carboxylic acid having a heterocycle is at least one compound selected from the group consisting of quinolinic acid, nicotinic acid, cinchomeronic acid, and pyridine-2,3,4- dicarboxylic acid.

10. The method according to claim 9, wherein said bi- or higher than bi-valent aromatic carboxylic acid having a heterocycle is quinolinic acid, which is included in the polishing slurry at a concentration of 0.1 to 1% by weight.

11. The method according to claim 11, wherein said complex causes radicals to be generated from the oxidizing agent and intensifies oxidizing power of the oxidizing agent.

12. The method according to claim 1, wherein said oxidizing agent oxidizes a surface of the aluminum-based metal to form an oxide, and said aromatic carboxylic acid forms a surface protective film with the oxide, said surface protective film being removed by polishing with the polishing slurry.

* * * * *